(12) United States Patent
Koo

(10) Patent No.: US 6,376,325 B1
(45) Date of Patent: Apr. 23, 2002

(54) METHOD FOR FABRICATING A FERROELECTRIC DEVICE

(75) Inventor: Bon-Jae Koo, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/666,741

(22) Filed: Sep. 20, 2000

(30) Foreign Application Priority Data

Sep. 21, 1999 (KR) ............................................. 99-40768

(51) Int. Cl.⁷ ............................................. H01L 21/20
(52) U.S. Cl. ..................... 438/396; 438/3; 438/250; 438/258; 438/643
(58) Field of Search ........................... 438/396, 3, 258, 438/643, 250

(56) References Cited

U.S. PATENT DOCUMENTS

| | | | |
|---|---|---|---|
| 5,489,548 A | 2/1996 | Nishioka et al. | 60/437 |
| 5,654,224 A | 8/1997 | Figura et al. | 396/438 |
| 5,807,774 A | 9/1998 | Desu et al. | 240/438 |
| 5,854,104 A | 12/1998 | Onishi et al. | 240/438 |
| 6,200,821 B1 * | 3/2001 | Back | 438/3 |
| 6,210,979 B1 * | 4/2001 | Kweon et al. | 438/3 |
| 6,211,005 B1 * | 4/2001 | Kang | 438/238 |
| 6,235,542 B1 * | 5/2001 | Yu | 438/3 |

* cited by examiner

*Primary Examiner*—Michael S. Lebentritt
*Assistant Examiner*—Pho Luu
(74) *Attorney, Agent, or Firm*—Marger Johnson & McCollom, P.C.

(57) ABSTRACT

A method for fabricating a ferroelectric device with improved ferroelectric characteristics and which can provide a reliable contact resistance of a barrier metal layer. The method includes forming an adhesion layer and a barrier metal layer to be electrically connected to the contact plug buried in an insulating layer. The adhesion layer and the barrier layer is then patterned to define an upper surface and a sidewall thereof. An oxidation barrier layer is formed on sidewalls of the patterned layer. An oxide electrode layer and a metal electrode layer are formed thereon for forming a lower electrode. Next, a ferroelectric film and an upper electrode layer are formed thereon. Subsequently, the upper electrode layer, ferroelectric film, platinum and the oxide electrode are patterned to form a ferroelectric capacitor. A diffusion barrier layer is then formed to protect the ferroelectric capacitor.

11 Claims, 5 Drawing Sheets

METHOD FOR FABRICATING A FERROELECTRIC DEVICE

This application relies for priority upon Korean Patent Application No. 1999-40768, filed on Sep. 21, 2000, the contents of which are herein incorporated by reference in their entirety.

BACKGROUND OF THE INVENTION

1. Field of the Invention

The present invention relates to the fabrication of a semiconductor device, and more particularly to a method for fabricating a ferroelectric device.

2. Background of the Invention

Modern data processing systems require that a substantial portion of the information stored in its memory be randomly accessible to ensure rapid access to the information. Because high speed operation is required of semiconductor memories, ferroelectric random access memories (FRAMs) have been researched and developed. Such FRAMs are nonvolatile memories with a ferroelectric capacitor including a pair of capacitor electrodes with a ferroelectric material between them. The ferroelectric material has two different stable polarization states that can be defined with a hysteresis loop depicted by plotting the polarization against applied voltage.

FRAMs are nonvolatile like flash memories and have many advantages. For example, they are programmable with a low voltage, e.g., less than 5 V (for flash memory, 18 to 22V is required), and have less than 40 nsec access time (for flash memory, microseconds are required). Also FRAMs are known for their durability, i.e., virtually unlimited numbers of read and write cycles, more than 1E12 cycles (for flash memory, only about 1E5 to 1E6 cycles are possible). FRAMs also consume low power and exhibit radiation hardness.

Conventionally, for the fabrication of FRAMs, a post-deposition annealing process is carried out on as-deposited ferroelectric material to allow a crystalline phase, i.e., a perovskite ferroelectric dielectric phase, which has the required ferroelectric dielectric characteristics. Typically ferroelectric materials are subjected to a heat treatment in excess of 550° C. for necessary crystallization. Also, the integration process requires an annealing step in an oxygen ambient. During these annealing processes at high temperatures or in an oxygen ambient, a thin insulating layer of oxide is formed at the interface between the lower electrode of a ferroelectric capacitor and the contact plug of a polysilicon. Polysilicon plugs are widely used for interconnection between capacitor lower electrodes and the junction regions of the access transistors because a contact plug structure is suitable for the recent trend toward high degree of integration of integrated circuits. Such an oxide insulating layer causes poor contact characteristic therebetween (i.e., increasing contact resistance). During these annealing processes, oxygen is introduced into the interface through two diffusion paths, one diffusion path along the sidewall of the lower electrode and the other diffusion path along the top surface of the lower electrode.

FIG. 1 and FIG. 2 are cross-sectional views of a semiconductor substrate schematically showing a ferroelectric capacitor according to U.S. Pat. No. 5,854,104 entitled "PROCESS FOR FABRICATING NONVOLATILE SEMICONDUCTOR MEMORY DEVICE HAVING A FERROELECTRIC CAPACITOR" and U.S. Pat. No. 5,489,548 entitled "METHOD OF FORMING HIGH-DIELECTRIC CONSTANT MATERIAL ELECTRODES COMPRISING SIDEWALL SPACES", the disclosure of which are incorporated herein by reference.

In FIG. 1, reference number 8 denotes a diffusion barrier layer of $TiO_2$, reference number 12 and 13 denote a lower electrode of a TiN and Pt respectively. Reference number 14 denotes a PZT film. According to the prior art of FIG. 1, the formation of the lower electrode patterns 12 and 13 is followed by PZT deposition and post-deposition annealing at high temperature. Also, after depositing the diffusion barrier layer 8, high temperature annealing above 500° C. in oxygen ambient is performed to improve barrier characteristics. Such high temperature annealing processes cause oxidation at the interface between TiN film 12 and the contact plug 11. The oxidation is caused by the diffusion of oxygen through the sidewall of the stacked ferroelectric capacitor. Oxygen also penetrates the platinum 13 easily to oxidize underlying TiN layer 12 thereby making the TiN layer 12 less conductive.

In FIG. 2, reference number 34 denotes a polysilicon contact plug, reference number 32 denotes an insulating layer ($SiO_2$), reference number 36 denotes an adhesion layer of TiN, reference number 40 denotes a sidewall oxidation barrier layer of $SiO_2$, reference number 42 denotes a lower electrode of a platinum electrode and reference number 44 denotes a high dielectric BST film. The high dielectric capacitor shown in FIG. 2 has a sidewall spacer 40, so that it can prevent oxidation of the TiN adhesion layer 36 at the lateral surface unlike the structure as shown in FIG. 1. However, there still remain some problems with this structure. For example, as described above, oxygen can diffuse through the platinum 42 easily into the underlying TiN layer 36 to oxidize the upper surface thereof. Also, the platinum electrode 42 does not normally adhere to the $SiO_2$ insulating layer 32, causing a so-called "lifting phenomenon."

As described above, the platinum is widely used as a lower electrode in ferroelectric film application since it is nonreactive to the ferroelectric film. The lower electrode layer is relatively thick and is a multi-layer structure to ensure anti-oxidation barrier for the contact plug. However, as the semiconductor device highly integrates, it becomes more and more difficult to etch such a thick lower electrode layer to form a lower electrode pattern. Particularly, a photoresist layer is relatively thin in high integration integrated circuit process to ensure accurate pattern formation. Accordingly, a photoresist layer can be etched completely during a photo-etching process. This damages the underlying ferroelectric capacitor, and degrades ferroelectric characteristics of the ferroelectric capacitor.

SUMMARY OF THE INVENTION

Therefore, it is an object of the present invention to provide a reliable ferroelectric capacitor overcoming the problems described above and method for fabricating the same.

In the present invention, a capacitor lower electrode is preferably formed of stacked patterns. An oxidation barrier layer is formed on sidewalls of a portion of the lower electrode. After that, the remainder of the lower electrode is formed. As a result, overall height of the electrode layers (lower electrode layer and upper electrode layer) and the ferroelectric layer that are to be etched after formation of the oxidation barrier layer is reduced. This minimizes consumption of the photoresist layer. In addition, the possibility of etching the electrode layer under the photoresist layer can be reduced.

More particularly, the lower electrode is made of a multi-layer structure having first and second lower electrode patterns. For this, the first lower electrode layer is formed on an interlayer-insulating layer that has a contact plug therein. After the first lower electrode layer is patterned to be electrically connected to the contact plug, the oxidation barrier layer is formed on sidewalls of the first lower electrode pattern to prevent oxidation thereof. Then, a second lower electrode layer, a ferroelectric layer and an upper electrode layer are sequentially formed. Using a photo-etching process, the upper electrode, ferroelectric and second lower electrode layers are etched and patterned to form a ferroelectric capacitor. The second lower electrode pattern extends outward from the outer edges of the first lower electrode pattern.

The oxidation barrier layer is preferably made of an insulating layer such as $SiO_2$ and $Si_3N_4$. The sidewall oxidation barrier layer is preferably formed by the steps of depositing an oxidation barrier material on the first lower electrode pattern and isotropically etching the oxidation barrier material to form the oxidation barrier layer on sidewalls of the first lower electrode pattern. Alternatively, the sidewall oxidation barrier layer can be formed by the steps of depositing an oxidation barrier material on the first lower electrode pattern and planarizing the oxidation barrier material until a top surface of the first lower electrode pattern is exposed.

The first lower electrode layer can be made of an adhesion layer and a conductive oxidation barrier layer. The second lower electrode layer can be made of a conductive oxide electrode and platinum. The adhesion layer may be made of a conductive material selected from the group consisting of Ti, Co and TiN. The conductive oxidation barrier layer may be made of iridium(Ir), ruthenium(Ru), or the like, and prevents oxidation of the underlying adhesion layer at a top surface. The oxidation barrier layer prevents oxidation of the adhesion layer at sidewalls thereof. The conductive oxide electrode may be $RuO_2$, $IrO_2$, or the like. The conductive oxide electrode layer serves as not only a lower electrode but also an adhesion layer between the upper platinum electrode and underlying oxidation barrier layer or an insulating layer.

The present invention provides a ferroelectric capacitor. The ferroelectric capacitor comprises an insulating layer formed on a semiconductor substrate, a contact plug formed in the insulating layer, a first lower electrode pattern formed on the insulating layer to be electrically connected to the contact plug, an oxidation barrier layer formed on the insulating layer and on a sidewall of the first lower electrode pattern, a second lower electrode pattern formed on the first lower electrode pattern and on the oxidation barrier layer, a dielectric pattern formed on the second lower electrode pattern, an upper electrode pattern formed on the dielectric pattern, and a diffusion barrier layer covering the second lower electrode pattern, the dielectric pattern and the upper electrode pattern.

The oxidation barrier layer is substantially the same level in height with the first lower electrode pattern.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

Figure 1:
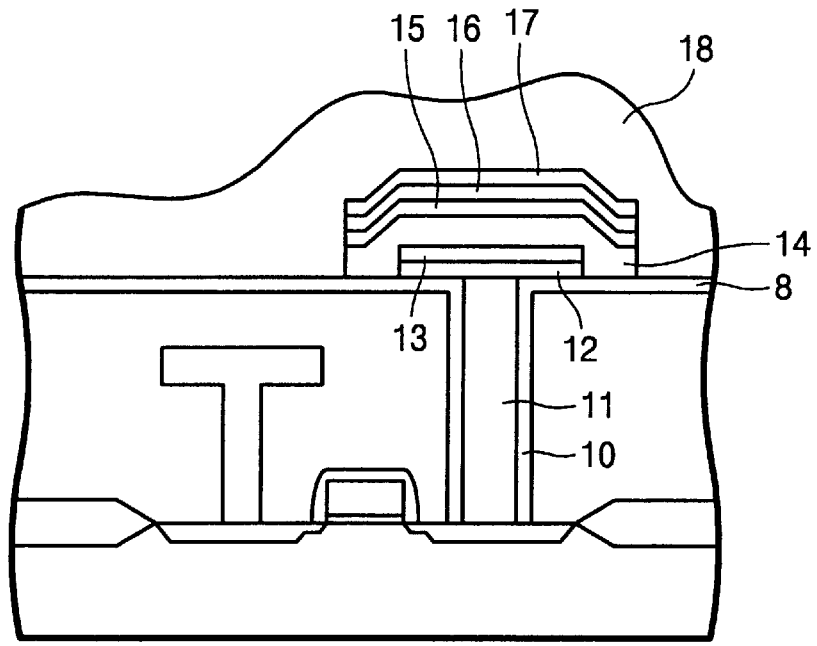
FIG. 1 is a cross-sectional view of a nonvolatile ferroelectric memory device according to a prior art.
Figure 2:
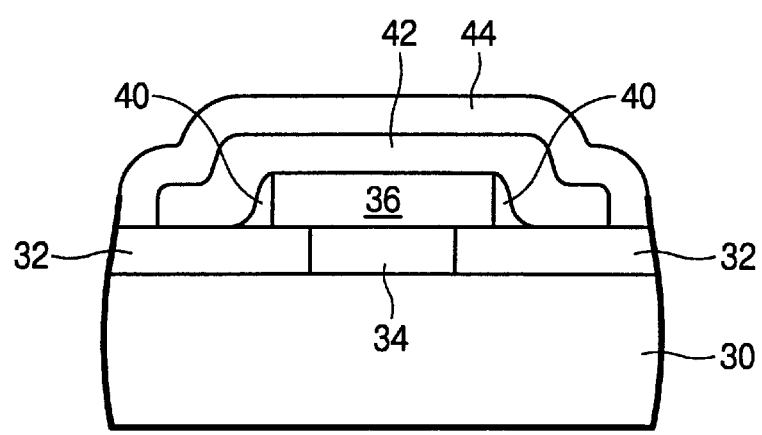
FIG. 2 is a cross-sectional view of a nonvolatile ferroelectric memory device according to another prior art.

The present invention will now be described more fully hereinafter with reference to the accompanying drawings, in which preferred embodiments of the invention are shown. This invention may, however, be embodied in different forms and the invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity.

Semiconductor manufacturing includes many process steps that are well known in the art. For example, the process of photolithography masking and etching is used extensively in several embodiments of the present invention. One standard photolithographic process includes creating a photolithography mask containing the pattern of the component to be formed, coating the wafer with a light sensitive material known as a photoresist, exposing the photoresist coated wafer to ultra-violet light through the mask to soften or harden parts of the photoresist (depending on whether positive or negative photoresist is used), removing the materials left unprotected by the photoresist and then stripping the remaining photoresist. Another well known process that is used extensively in this and many other integrated circuit fabrication processes is chemical mechanical polishing (CMP) for planarization. These and other standard processes are referred to extensively herein without a detailed discussion of well-known technologies.

An integrated circuit FRAM device typically comprises a storage capacitor and an access transistor. Either the source or drain of the access transistor is connected to one terminal of the capacitor. The other side of the transistor's channel and the transistor gate electrode are connected to external connection lines called a bit line and a word line, respectively. The other terminal of the capacitor is connected to a reference voltage. The formation of a FRAM cell includes the formation of a transistor, a capacitor and contacts to external circuits. The present invention relates to a nonvolatile ferroelectric memory device, and more particularly to a method of forming a ferroelectric capacitor. Therefore, the formation of the access transistor and bit line formation that are well known in the art will be briefly described.

Figure 3A:
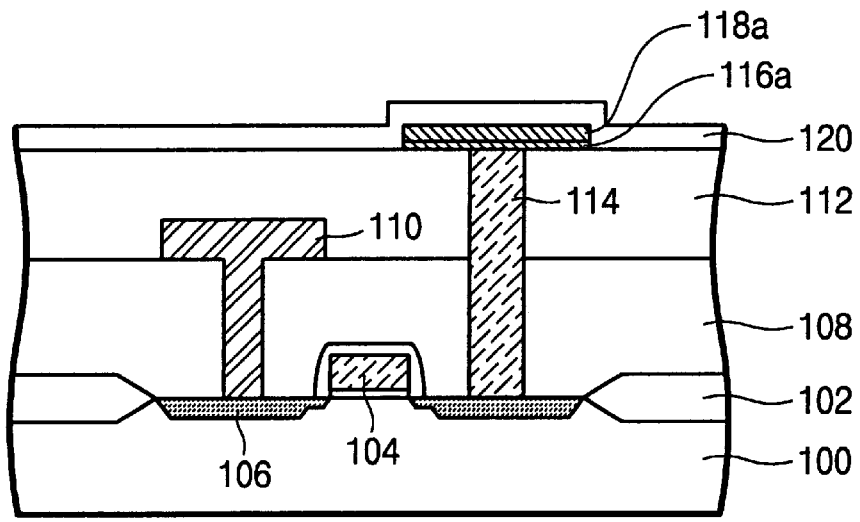
FIGS. 3A to 3F are cross-sectional views of a semiconductor substrate, at selected stages of a method for fabricating a ferroelectric memory device according to an embodiment of the present invention.

Hereinafter, the formation of a ferroelectric capacitor will be fully described particularly with reference to following FIGS. 3A to 3F and FIG. 4. Referring now to FIG. 3A, there is provided a semiconductor substrate 100. Active and inactive regions are defined by a device isolation process that forms a device isolation region 102. The active region is the region to which electrical connection is to be made. The device isolation process can be performed by conventional isolation techniques such as LOCOS (local oxidation of silicon) technique or STI (shallow trench isolation) technique. Other suitable processes can be also employed.

After defining the active region, transistor formation process is carried out. A gate oxide layer is grown on substrate 100 for electrical separation between the substrate 100 and to-be-formed gate electrode of the transistor. A gate electrode layer and gate capping layer are deposited on the gate oxide layer and patterned into a predetermined configuration, i.e., gate electrode 104. After forming the gate electrode 104, conventional ion implanting process is carried out to form low concentration impurity diffusion regions within the substrate 100 outside of the gate electrode 104. Then, sidewall spacers are formed on sidewall of the gate electrode 104 and high concentration impurity ions are implanted to form high concentration impurity diffusion regions by using the spacers as a mask, to complete LDD (lightly doped drain) structure source/drain regions 106. The gate electrode 104 and the source/drain regions 106 form the transistor.

Next, a first interlayer insulating layer 108 is formed on the substrate 100 including the transistor. The first interlayer insulating layer 108 may be formed of CVD (chemical vapor deposition) oxide, such as BPSG (borophosphosilicate glass).

The next process sequence is the formation of a bit line 110. The first interlayer insulating layer 108 is patterned to form a bit line contact hole, exposing one of the source/drain regions 106. A metal such as tungsten is deposited in the contact hole and on the first interlayer insulating layer 108. The deposition of the tungsten can be carried out by conventional techniques such as a sputtering technique. Other suitable techniques also can be employed. Deposited tungsten is then patterned to form the bit line 110.

Then, a second interlayer insulating layer 112 is deposited on the first interlayer insulating layer 108 including the bit line 110. The second interlayer insulating layer 112 is formed of CVD oxide. For electrical connection between the transistor and later-formed ferroelectric capacitor, a contact plug formation process is carried out. More particularly, the second and first interlayer insulating layers 112 ad 108 are patterned to form a contact hole for the capacitor contact plug, exposing the other of the source/drain regions 106. A conductive material such as a doped polysilicon is formed in the contact hole and on the second interlayer insulating layer 112. Then, a planarization process such as CMP is carried out to form a contact plug 114.

The next process sequence is the formation of the ferroelectric capacitor. Initially, a first lower electrode layer is formed and patterned into desired configuration (i.e., first lower electrode pattern). More particularly, an adhesion layer and a conductive oxidation barrier layer are sequentially deposited on the second interlayer insulating layer 112 including the contact plug 114. The deposited layers are then patterned using a photolithography process to form a first lower electrode pattern 116a and 118a to be electrically connected to the contact plug 114. The adhesion layer may be formed of Ti (titanium), Co (cobalt), TiN (titanium nitride), or the like in order to improve adhesion between the conductive oxidation barrier layer 118a and the insulating layer 112. The conductive oxidation barrier pattern 118a may be made of a refractory metal such as iridium, ruthenium, or the like. This conductive oxidation barrier pattern 118a prevents oxidation of underlying adhesion layer pattern 116a at its top surface.

Figure 3B:
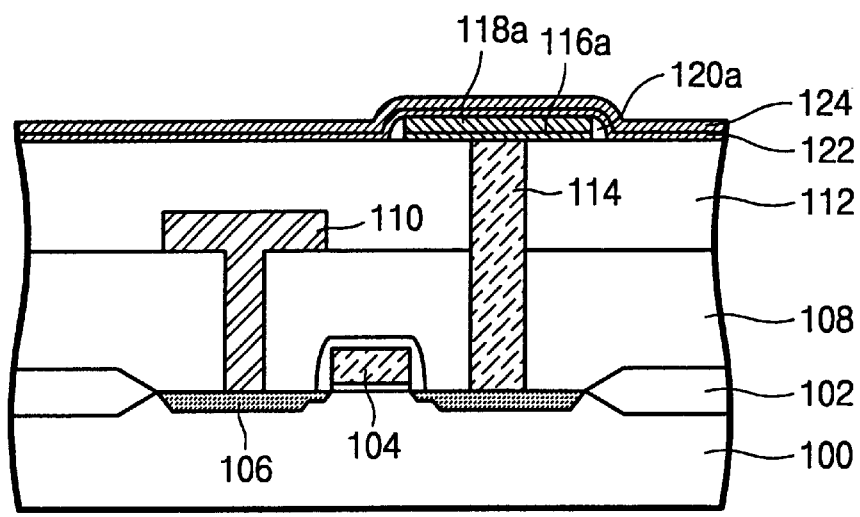

In order to prevent oxidation of the sidewall of the first lower electrode patterns 116a and 118a, a sidewall oxidation barrier formation process is carried out. An oxidation barrier layer 120 is formed on the second interlayer insulating layer 112 including the first lower electrode pattern 116a and 118a and follows the contour of the underlying structure caused by the second interlayer insulating layer 112 and the first lower electrode pattern 118a Then, an anisotropic etching process is carried out to form the oxidation barrier sidewall spacer 120a as shown in FIG. 3B. The oxidation barrier sidewall spacer 120a may be made of an insulating material such as $SiO_2$, $Si_3N_4$, or the like. The oxidation barrier sidewall spacer 120a may also improve the step coverage of later-deposited ferroelectric layer by rounding the corner of upper portion of the patterned first lower electrode.

Next, second lower electrode layers are formed. More particularly, a conductive oxide electrode layer 122 and a metal electrode layer 124 are formed on the second insulating layer 112, and on the first lower electrode pattern 116a and 118a, and on the oxidation barrier sidewall spacer 120a as shown in FIG. 3B. The conductive oxide electrode layer 122 may be made of iridium dioxide ($IrO_2$), ruthenium dioxide ($RuO_2$), or the like. Preferably, the metal electrode layer 124 may be platinum (Pt). The conductive oxide layer 122 also serves as an adhesion layer between underlying second interlayer insulating layer 112 and the overlying platinum electrode layer 124. The platinum electrode 124 exhibits an excellent crystalline structure for the growth of the ferroelectric material.

Figure 3C:
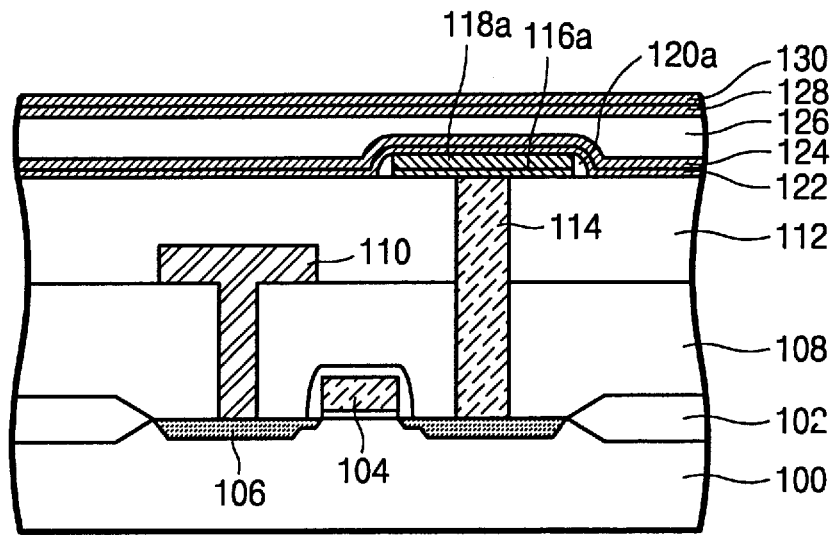

Referring now to FIG. 3C, a dielectric layer such as ferroelectric layer 126 is deposited on the platinum electrode layer 124 by a sol-gel method and the resulting structure is subjected to high temperature annealing for crystallization. Then upper electrode layers 128 and 130 are deposited on the ferroelectric layer 126. Like second lower electrode layers, the upper electrode layers 128 and 130 may be made of an oxide electrode 128 such as iridium dioxide and a metal electrode 130 such as iridium. Alternatively, the upper electrode layers can be made of the same process and material as the above-described second lower electrode layers. Also, a single layer of metal electrode such as platinum and iridium, and a conductive oxide electrode, and a double layer including a combination of metal and conducive oxide electrode can be also employed.

Figure 3D:
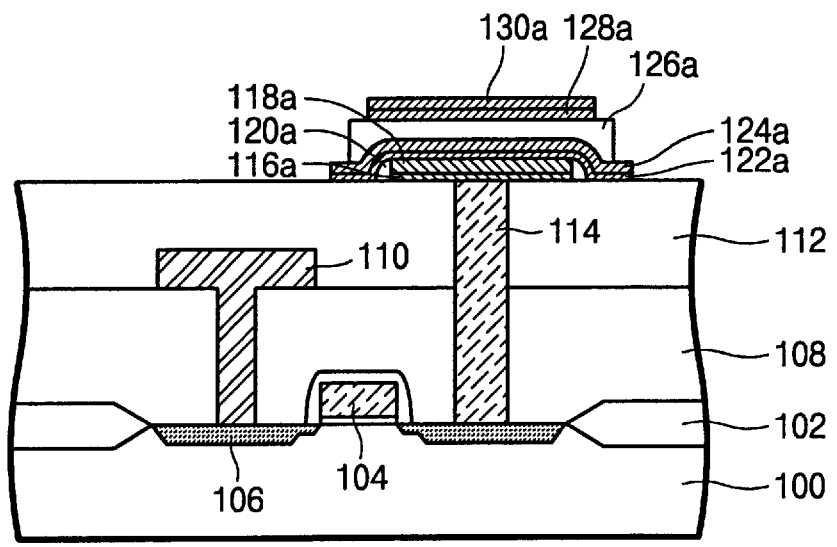

The next process sequence is etching the formed-layers 130, 128, 126, 124, and 122 to form predetermined patterns 130a, 128a, 126a, 124a and 122a to form the ferroelectric capacitor as shown in FIG. 3D. The upper electrode layers 130 and 128 and the ferroelectric layer 126 are firstly etched and annealing is carried out to cure etching damage. Then the second lower electrode layers 122 and 124 are patterned by etching. The second lower electrode layers 122 and 124 are patterned to extend outward from the outer edges of the oxidation barrier sidewall spacer 120a to a predetermined distance. As understood from the explanation, because a portion of the lower electrode layer (i.e., the first lower electrode) already has been patterned by etching, the overall thickness of the layers to be etched in this photo-etching process is decreased to that extent, thereby reducing etching time and reducing consumption of a photoresist layer.

Figure 3E:
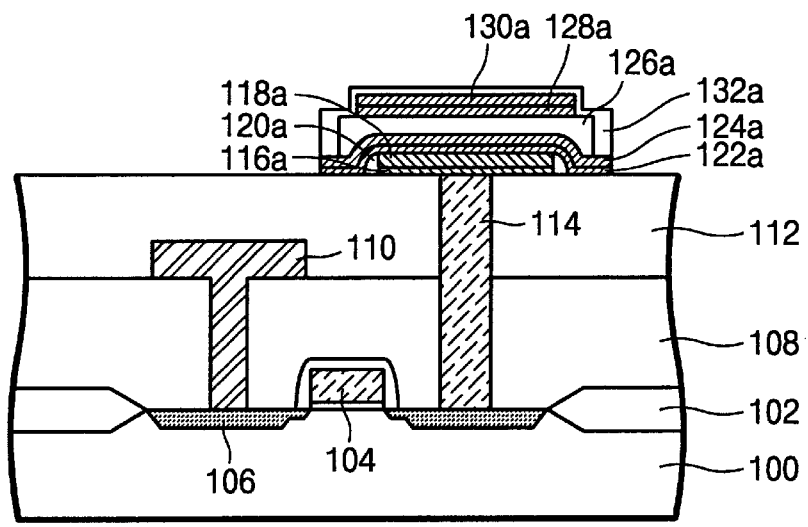

Referring now to FIG. 3E, a diffusion barrier layer pattern 132a is formed to cover the ferroelectric capacitor. First, a diffusion barrier layer is deposited on the second interlayer insulating layer 112 including the ferroelectric capacitor. Then high temperature annealing above 500° C. in oxygen ambient is carried out to improve barrier characteristics. After high temperature annealing, the diffusion barrier layer is patterned by etching into a predetermined configuration to cover at least the ferroelectric capacitor. The diffusion barrier layer may be made of a $TiO_2$, $Al_2O_3$, or the like. The barrier layer prevents any material diffusion between the ferroelectric capacitor and surrounding environment thereof.

Figure 3F:
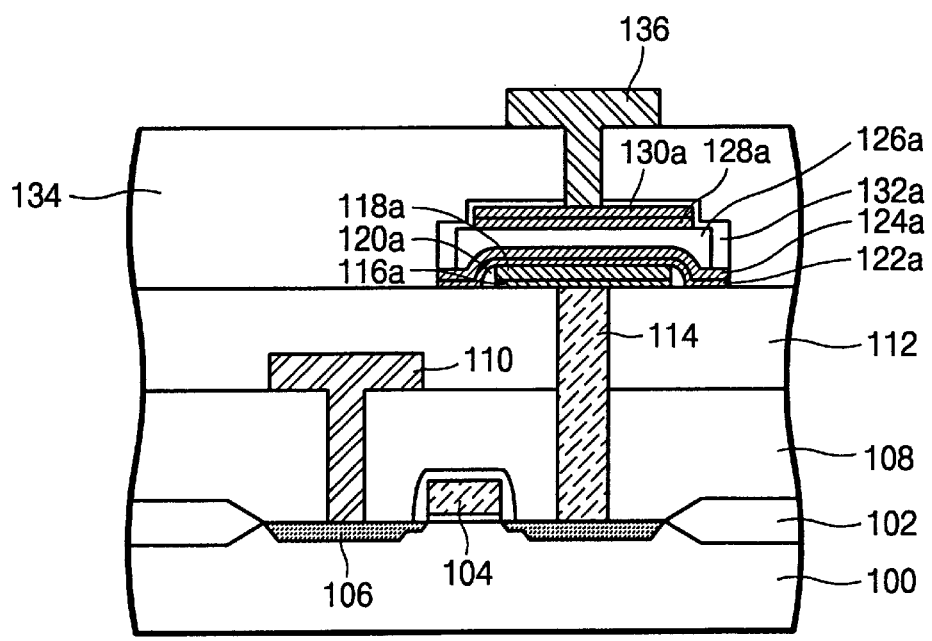

The next process sequence is the formation of a plate line 136. As shown in FIG. 3F, a third interlayer insulating layer 134 is deposited on the ferroelectric capacitor and on the second interlayer insulating layer 112. Then a selected portion of the third interlayer insulating layer 134 is patterned to form a plate line contact hole that exposes a portion of the upper electrode. An annealing process in oxygen ambient is carried out to cure etching damage. A conductive material is deposited on the third interlayer insulating layer 134 to fill the contact hole and patterned into a predetermined configuration, i.e., plate line 134 which is electrically connected to the upper electrode capacitor.

Figure 4:
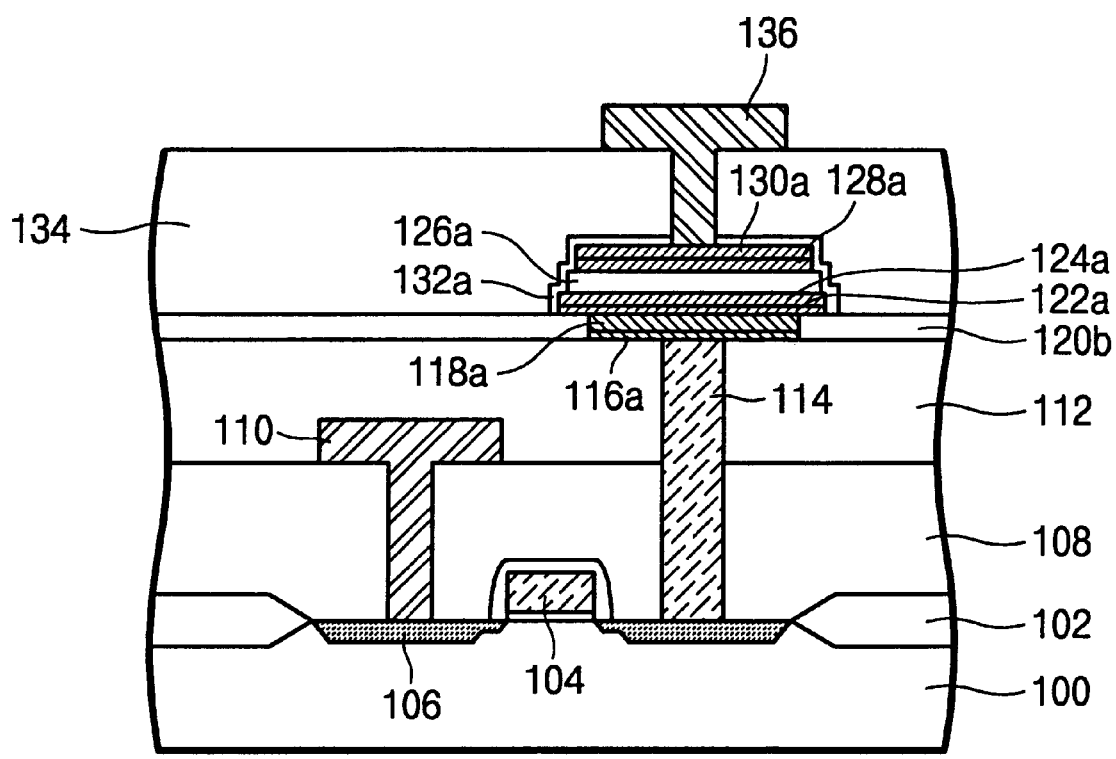
FIG. 4 is a cross-sectional view of a ferroelectric memory device according to modified embodiment of the present invention.

Another embodiment of the present invention will be described with reference to FIG. 4. FIG. 4 schematically shows a cross section of a ferroelectric capacitor according to another embodiment of the present invention. In FIG. 4, same part functioning as shown in FIGS. 3A to 3F are identified with same reference number and their explanation will be omitted. As can be seen in FIG. 4, the sidewall oxidation barrier layer 120b in this embodiment is different from that seen in FIGS. 3A to 3F. The sidewall oxidation barrier 120b in FIG. 4 extends outwardly from the sidewall of the first lower electrode pattern 116a and 118a over the substantially entire surface of the second interlayer insulating layer 112. In the ferroelectric capacitor shown in FIG. 4, the sidewall oxidation barrier layer 120b is formed by the process of depositing an oxidation barrier layer 120 on the second interlayer insulating layer 112 including the first lower electrode pattern 116a and 118a and planarizing the oxidation barrier layer until a top surface of the first lower electrode pattern is exposed by conventional planarization techniques such as CMP (chemical mechanical polishing) or an etch back technique. Such planarization processes provide a better surface topology with subsequent deposition of the ferroelectric material.

Accordingly, the oxidation barrier layer 120b is positioned on the substantially entire surface of the insulating layer 112 and on a sidewall of the first lower electrode patterns 116a and 118a. Also, the oxidation barrier layer 120b is the same level in height with the first lower electrode pattern 116a and 118a. Such planar surface provides better surface topology for later-deposited layers. More particularly, the ferroelectric capacitor comprises insulating layers 108 and 112 formed on a semiconductor substrate 100, a contact plug 114 formed therein, a multi-layered first lower electrode pattern 116 and 118a formed on the insulating layer 112 to be electrically connected to the contact plug 114, an oxidation barrier layer 120b, a multi-layered second lower electrode pattern 122a and 124a formed on the first lower electrode pattern 118a and on a portion of the oxidation barrier layer 120b, a dielectric pattern 126a formed on the second lower electrode pattern 124a, a multi-layered upper electrode pattern 128a and 130a formed on the dielectric pattern 126a and a diffusion barrier layer pattern 132a covering the second lower electrode pattern 122a and 124a, the dielectric pattern 126a and the upper electrode pattern 128a and 130a.

According to the present invention, the oxidation barrier layer is formed after a first lower electrode layer is patterned, thereby decreasing the thickness of overall lower electrode that is to be etched in a subsequent photo-etching process for completing capacitor electrode. The oxidation barrier sidewall spacer can advantageously prevent the oxidation of the upper portion of lower electrode at the sidewall thereof during high temperature annealing which is typically carried out in the ferroelectric memory device process.

What is claimed is:

1. A method for fabricating a ferroelectric device, comprising:

forming an interlayer insulating layer on a semiconductor substrate, the interlayer insulating layer having a contact plug therein;

forming a first lower electrode pattern of a capacitor over the interlayer insulating layer to be electrically connected to the contact plug;

forming an oxidation barrier layer at least on a sidewall of the first lower electrode pattern;

sequentially forming a second lower electrode pattern layer, a dielectric layer and an upper electrode layer overlying the first lower electrode pattern and on the oxidation barrier layer; and patterning the upper electrode layer, the dielectric layer and the second lower electrode pattern layer, to form an upper electrode pattern, a dielectric pattern and a second lower electrode pattern, wherein the first and second lower electrode patterns, the dielectric pattern and the upper electrode pattern form a ferroelectric capacitor.

2. The method according to claim 1, wherein the step of forming an oxidation barrier layer at least on a sidewall of the first lower electrode pattern comprises;

forming an oxidation barrier material layer on the first lower electrode pattern and on the interlayer insulating layer; and etching back the oxidation barrier material layer.

3. The method according to claim 1, wherein the step of forming an oxidation barrier layer on a sidewall of the first lower electrode pattern comprises;

forming an oxidation barrier material layer on the first lower electrode pattern and on the interlayer insulating layer; and planarizing the oxidation barrier material layer until a top surface of the first lower electrode pattern is exposed.

4. The method according to claim 1, wherein the step of forming a first lower electrode pattern comprises:

forming an adhesion layer over the interlayer insulating layer;

forming a conductive barrier layer on the adhesion layer; and, patterning the adhesion and conductive barrier layers to form the first lower electrode pattern, wherein the second lower electrode pattern layer is made of a double layer including an oxide electrode layer and a metal electrode layer.

5. The method according to claim 4, wherein the adhesion layer is made of a conductive material selected from the group consisting of TiN, Ti and Co, and the conductive barrier layer is made of a conductive material selected from the group consisting of Ir and Ru, and the oxidation barrier layer is made of an insulating material selected from the group consisting of $SiO_2$ and $Si_3N_4$, and the oxide electrode is made of a conductive material selected from the group consisting of $IrO_2$ and $RuO_2$ and the metal electrode comprises a platinum.

6. The method according to claim 5, wherein the second lower electrode pattern extends outward from the outer edges of the first lower electrode pattern on the interlayer insulating layer to a predetermined distance.

7. The method according to claim 5, wherein the oxidation barrier layer prevents oxidation of the sidewall of the first lower electrode pattern, and the conductive barrier layer prevents oxidation of the adhesion layer at an upper surface thereof.

8. The method according to claim 1, further comprising forming a diffusion barrier layer to cover at least the ferroelectric capacitor.

9. The method according to claim 8, wherein the diffusion barrier layer is made of one selected from the group consisting of $TiO_2$ and $Al_2O_3$.

10. A method for fabricating a ferroelectric device, comprising:

forming an interlayer insulating layer on a semiconductor substrate, the interlayer insulating layer having a contact plug therein;

forming a first lower electrode pattern of a capacitor over the interlayer insulating layer to be electrically connected to the contact plug;

forming an oxidation barrier layer at least on a sidewall of the first lower electrode pattern;

forming a second lower electrode pattern layer on the first lower electrode pattern and on the oxidation barrier layer;

forming a dielectric layer on the second lower electrode pattern layer;

forming an upper electrode layer on the dielectric layer; and patterning the upper electrode layer, the dielectric layer and the second lower electrode pattern layer, to form an upper electrode pattern, a dielectric pattern and a second lower electrode pattern to form a ferroelectric capacitor.

11. The method according to claim 10, wherein the step of forming a first lower electrode pattern comprises:

forming an adhesion layer over the interlayer insulating layer;

forming a conductive barrier layer on the adhesion layer; and, patterning the adhesion and conductive barrier layers to form the first lower electrode pattern, wherein the second lower electrode pattern layer is made of a double layer including an oxide electrode layer and a metal electrode layer.

* * * * *